United States Patent [19]

Hayashi et al.

[11] Patent Number: 5,180,995

[45] Date of Patent: Jan. 19, 1993

[54] TEMPERATURE-COMPENSATED RING OSCILLATOR CIRCUIT FORMED ON A SEMICONDUCTOR SUBSTRATE

[75] Inventors: Isamu Hayashi; Harufusa Kondoh, both of Hyogo, Japan

[73] Assignee: Mitsubishi Denki Kabushiki Kaisha, Tokyo, Japan

[21] Appl. No.: 825,219

[22] Filed: Jan. 24, 1992

[30] Foreign Application Priority Data

Sep. 13, 1991 [JP] Japan .................. 3-234291

[51] Int. Cl.$^5$ ............................................. H03L 1/02
[52] U.S. Cl. ...................................... 331/57; 331/176; 331/186
[58] Field of Search ................... 331/57, 176, 186

[56] References Cited

U.S. PATENT DOCUMENTS

| | | | |
|---|---|---|---|
| 4,015,219 | 3/1977 | Kawagoe et al. | 331/57 X |
| 4,853,654 | 8/1989 | Sakurai | 331/176 X |
| 5,072,197 | 12/1991 | Anderson | 331/57 |

FOREIGN PATENT DOCUMENTS 57-97218  6/1982  Japan .

OTHER PUBLICATIONS

Design of a 4-MHz Analog Integrated CMOS Transconductance-C Bandpass Filter IEEE Journal of Solid-State Circuits, vol. 23, No. 4, Aug. 1988, pp. 987-996.

1991 Symposium on VLSI Circuits Digest of Technical Papers JSAP Cat. No. AP911211 IEEE Cat. No. 91 CH 3018-9, May-Jun. 1991/OISO, pp. 73-74.

Gray et al., Analysis and Design of Analog Integrated Circuits Chapter 12: MOS amplifier Design, Section 3: Temperature and Supply-Independent Biasing pp. 736-737.

*Primary Examiner*—Siegfried H. Grimm

[57] ABSTRACT

An improved ring oscillator is disclosed which can be formed in a semiconductor substrate. The ring oscillator includes inverters cascaded in a ring-like manner, and a diffused resistor R1 having a positive temperature coefficient and a polysilicon resistor R2 having a negative temperature coefficient for determining bias currents supplied to the inverters. The oscillation frequency tends to decrease with a rise of ambient temperature based on a temperature characteristic of diffused resistor R1 and a temperature characteristic of the oscillator circuit itself; however, the change of oscillation frequency is compensated by a temperature characteristic of polysilicon resistor R2. Therefore, a reference clock signal generating circuit having an oscillation frequency which is not affected by change of the ambient temperature can be formed in the semiconductor substrate.

7 Claims, 8 Drawing Sheets

TEMPERATURE-COMPENSATED RING OSCILLATOR CIRCUIT FORMED ON A SEMICONDUCTOR SUBSTRATE

BACKGROUND OF THE INVENTION

1. Field of the Invention

The present invention generally relates to ring oscillator circuits formed on semiconductor substrates and, more particularly, to a ring oscillator circuit which is not easily affected by change of ambient temperature.

2. Description of the Background Art

Generally, an oscillator circuit for generating a reference clock signal is widely used to implement various electric circuits. In particular, a crystal oscillator circuit including a crystal vibrator has been frequently used since it can generate a clock signal having an extremely stable and constant frequency. However, the crystal oscillator circuit cannot be formed on a semiconductor substrate, so that it is connected to a semiconductor integrated circuit device to a printed circuit board. This increases the number of parts needed to constitute a circuit and also increases time consumed for work of mounting the parts. In addition, it is also pointed out that a crystal vibrator is generally expensive. Therefore, it has been desired to provide a cheaper oscillator circuit having a stable and constant oscillation frequency on a semiconductor substrate, that is to say, to form an on-chip oscillator. However, an oscillation frequency of the on-chip oscillator is generally unstable, and in particular, influence of change of ambient temperature cannot be avoided. Hence, in spite of increase in the number of parts and time for work of mounting the parts, a crystal oscillation circuit is mounted on a printed circuit board, so that the circuit is connected to a semiconductor integrated circuit device through the board.

Although the present invention is generally applicable to a semiconductor integrated circuit device which needs a clock signal having a stable oscillation frequency, a case in which the present invention is applied to interface LSI in an Integrated Services Digital Network (ISDN) as one example of a semiconductor integrated circuit device will be described below.

Figure 10:
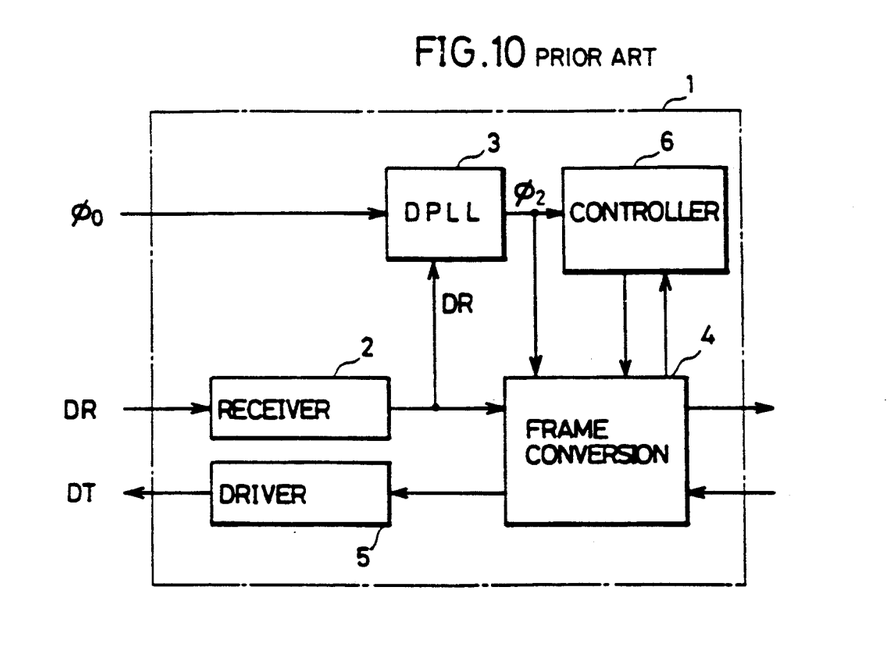
FIG. 10 is a block diagram of an interface LSI for an ISDN.

FIG. 10 is a block diagram of an interface LSI for an ISDN. Referring to FIG. 10, the interface LSI 1 comprises a receiver 2 receiving a received data signal DR, a frame converter 4 performing frame conversion of the received data and transmitted data, a driver 5 outputting a transmitted data signal DT. Frame converter 4 is connected to an upper circuit (not shown) in an ISDN.

Digital phase locked loop (hereinafter referred to as "DPLL") 3 receives the received data signal DR through receiver 2. A reference clock signal $\phi 0$ generated from an externally provided crystal oscillator (not shown) is applied to DPLL 3. DPLL 3 is responsive to the clock signal $\phi 0$ and outputs a clock signal $\phi 2$ synchronized with the received data signal DR. The clock signal $\phi 2$ is applied to frame converter 4 and a controller 6. Frame converter 4 performs conversion of sequence of data and data transfer speed in response to applied clock signal $\phi 2$. Controller 6 generates various clock signals necessary to control an internal circuit of the interface LSI 1 in response to clock signal $\phi 2$. If the frequency of the clock signal $\phi 0$ is changed for some reason, DPLL 3 gets to have an offset value. As a result, the pull-in range of DPLL 3 becomes narrow. It is pointed out that a clock signal having stable frequency should be applied as the clock signal $\phi 0$. The reference numeral 1 also denotes a semiconductor substrate, on which the whole circuit for the interface LSI is formed. A crystal oscillator generating reference clock signal $\phi 0$ is provided separately from interface LSI 1 and connected to interface LSI 1 through a printed circuit board not shown.

Figure 11:
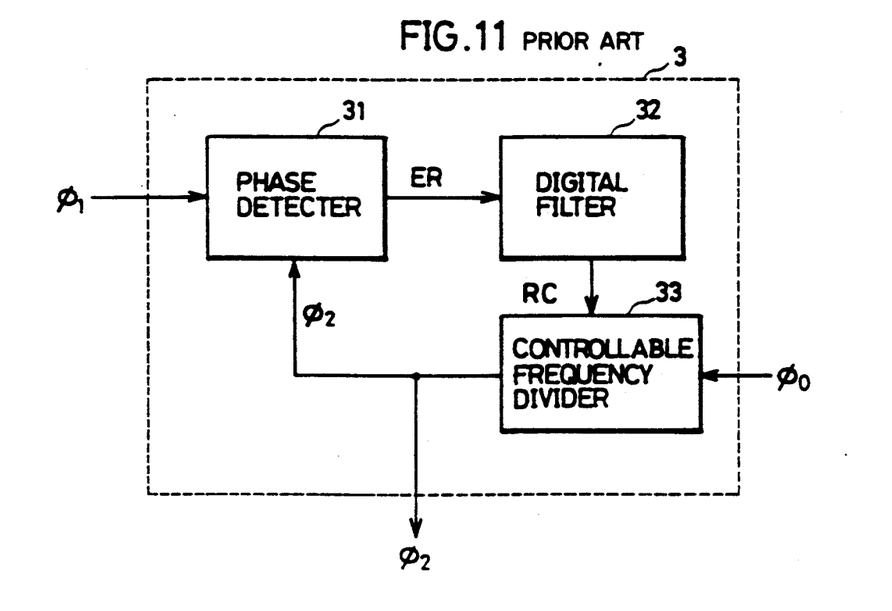
FIG. 11 is a block diagram of a DPLL shown in FIG. 10.

FIG. 11 is a block diagram of DPLL 3 shown in FIG. 10. Referring to FIG. 11, DPLL 3 comprises a phase detector 31 detecting an error between a phase of clock signal $\phi 1$ and a phase of clock signal $\phi 2$, a digital filter 32 receiving an error signal ER provided from phase detector 31, a controllable frequency divider 33 in which its ratio of frequency division can be controlled in response to a frequency-division-ratio controlling signal RC provided from digital filter 32.

In operation, controllable frequency divider 33 receives reference clock signal $\phi 0$ and provides clock signal $\phi 2$ whose frequency is controlled in response to frequency-division-ratio controlling signal RC. Phase detector 31 detects a phase difference between clock signals $\phi 1$ and $\phi 2$, and applies error signal ER indicating the phase difference to digital filter 32. Digital filter 32 removes extremely small signal components included in error signal ER and applies frequency-division-ratio controlling signal RC based on error signal ER to controllable frequency divider 33. A ratio of frequency division of controllable frequency divider 33 is controlled in response to frequency-division-ratio controlling signal RC. Controllable frequency divider 33 outputs clock signal $\phi 2$ having a renewed frequency.

Since interface LSI 1 shown in FIG. 10 does not comprise a reference clock signal generating circuit for generating reference clock signal $\phi 0$, inconveniences arising from increase in the number of parts and time consumed for work of mounting the parts are caused as mentioned before. To avoid these inconveniences, an interface LSI comprising a reference clock signal generator is desired.

Figure 12:
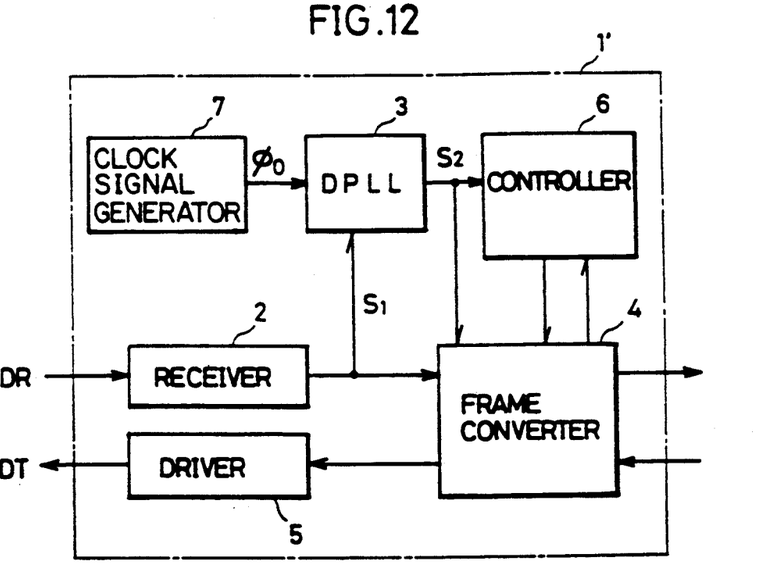
FIG. 12 is a block diagram of an interface LSI comprising an internal reference clock signal generator.

FIG. 12 is a block diagram of an interface LSI 1' comprising a reference clock signal generator. Referring to FIG. 12, interface LSI 1' additionally comprises an internal clock signal generator 7 generating reference clock signal $\phi 0$, compared with interface LSI 1 shown in FIG. 10. Internal clock signal generator 7 is formed within a semiconductor substrate together with other circuits to constitute interface LSI 1'. As clock signal generator 7 which can be formed within a semiconductor substrate, a ring oscillator comprising an odd number of inverters cascaded in a ring-like manner is frequently used. However, the oscillation frequency of the ring oscillator is not stable, and in particular, it is easily affected by change of ambient temperature. The oscillation frequency of the ring oscillator varies with ambient temperature. This brings about an undesirable result in such a circuit which needs a stable reference clock signal as shown in FIG. 12. Therefore, it is necessary to form a ring oscillator circuit in a semiconductor substrate which is not easily affected by change of ambient temperature.

Figure 13:
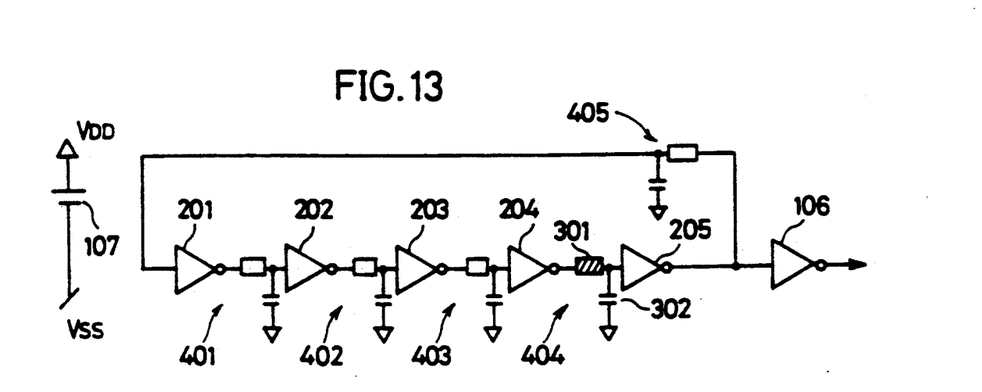
FIG. 13 is a circuit diagram of a conventional ring oscillator.

FIG. 13 is a circuit diagram of a conventional improved ring oscillator. The ring oscillator shown in FIG. 13 is disclosed in Japanese Patent Laying-Open No. 57-97218. Referring to FIG. 13, the ring oscillator comprises inverters 201 through 205 cascaded in a ring-like manner, RC circuit 401 through 405 positioned between respective ones of inverters 201 through 205, and a constant voltage source 107. Each of RC circuits determines a time period necessary to charge and discharge an input of an inverter succeeding the circuit. The oscillation frequency of the ring oscillator is determined depending on a time constant of RC circuits 401 through 405.

As a resistor provided within each of RC circuits 401 through 405, a diffused resistor formed in a semiconductor substrate is used. A diffused resistor and an on-resistor of a MOS transistor generally have a positive temperature coefficient. These resistance values increase as ambient temperature becomes high. Therefore, the oscillation frequency of the ring oscillator decreases as ambient temperature becomes high. That is to say, the oscillation frequency of the ring oscillator has a negative temperature coefficient. However, the ring oscillator shown in FIG. 13 comprises RC circuit 404 including a resistor 301 having a negative temperature coefficient, so that influence of change of ambient temperature on the oscillation frequency can be mitigated. As resistor 301 having a negative temperature coefficient, a polysilicon resistor is used.

However, the ring oscillator shown in FIG. 13 causes the following problem. Since RC circuits 401 through 405 for determining the oscillation frequency are connected in a ring of the cascaded inverters, a high oscillation frequency cannot be obtained. In order to obtain a high oscillation frequency, it is necessary to decrease a resistance value and a capacitance value of each of RC circuit 401 through 405; however these cannot be lowered so much as to prevent implementation of the aforestated temperature compensation. As a ring oscillator capable of generating a clock signal having a high oscillation frequency, a ring oscillator described below can be conceivable.

Figure 2:
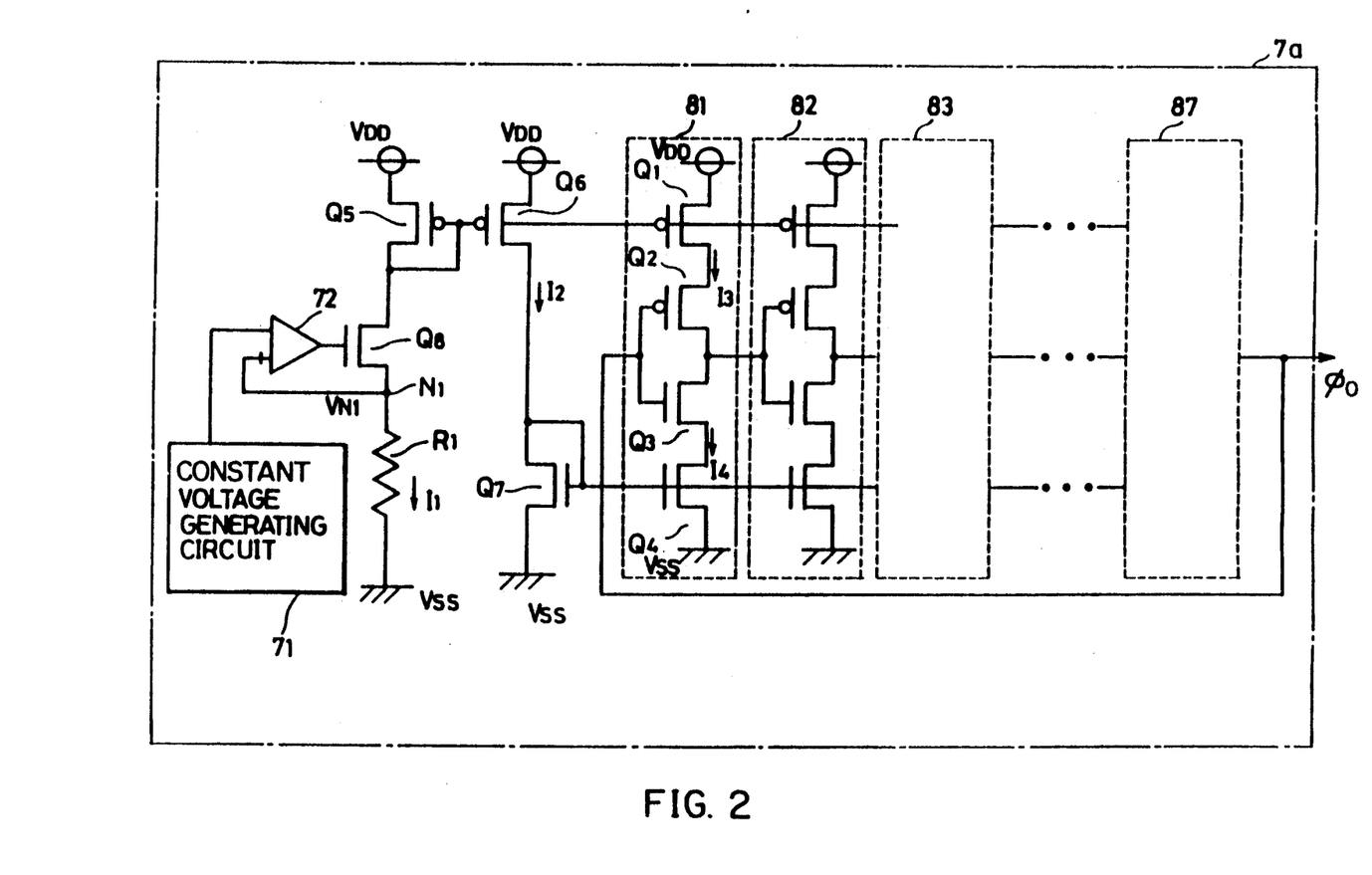
FIG. 2 is a circuit diagram of a ring oscillator showing the background of the present invention.

FIG. 2 is a circuit diagram of a ring oscillator showing the background of the present invention. Referring to FIG. 2, the ring oscillator 7a comprises 7 inverters 81 through 87 cascaded in a ring-like manner, PMOS transistors Q5 and Q6, NMOS transistors Q7 and Q8, a bias circuit constituted by an operational amplifier 72 and a resistor R1, and a constant voltage generating circuit 71. One inverter, for example, inverter 81 comprises PMOS transistors Q1, Q2 and NMOS transistors Q3, Q4 connected in series between a power supply potential $V_{DD}$ and a ground potential $V_{SS}$. Transistors Q2 and Q3 have the gates connected to receive output signals from a preceding inverter (that is, inverter 87).

Operation of ring oscillator 7a shown in FIG. 2 will be described. A common connecting node N1 of transistor Q8 and resistor R1 is maintained at a constant voltage generated from constant voltage generating circuit 71 by operational amplifier 72 and transistor Q8. A current I1 determined by a resistance value of resistor R1 flows through resistor R1. Assume that a voltage at node N1 is VN1 and that a resistance value of resistor R1 is R1, and current I1 can be shown by the following expression.

$$I1 = VN1/R1 \qquad (1)$$

Assume that gate width and gate length of transistor Q5 are W5 and L5, respectively, that gate width and gate length of transistor Q6 are W6 and L6, respectively, and that the current mirror circuit has a ratio of current of 1:1, and the following expression can be obtained.

$$W5/L5 = W6/L6 \qquad (2)$$

Therefore, $$I1 = I2 \qquad (3)$$

where I2 shows a current value of current flowing in transistor Q6.

Assume that gate widths and gate lengths of transistors Q1, Q4 and Q7 are W1 and L1; W4 and L4; W7 and L7, respectively, and an expression (6) can be obtained when the following expressions (4) and (5) are satisfied.

$$W1/L1 = W6/L6 \qquad (4)$$

$$W4/L4 = W7/L7 \qquad (5)$$

$$I3 = I4 = I2 \; (=I1) \qquad (6)$$

where currents I3 and I4 indicate current values of currents flowing through transistors Q1 and Q4, respectively.

Generally, the oscillation frequency of a ring oscillator increases as currents I3 and I4 become larger. That is, the oscillation frequency of a ring oscillator increases with increase of current supplied to an individual inverter. That is because, if current supplied to an individual inverter is increased, time needed to charge and discharge an input node of an succeeding inverter is decreased. On the other hand, if supply current is decreased, longer time to charge and discharge the input node of the succeeding inverter is necessary and the oscillation frequency becomes lower. Therefore, the oscillation frequency of the ring oscillator increases in proportion to supply currents I3 and I4 (additionally to I2 and I1).

As resistor R1 shown in FIG. 2, a diffused resistor formed in a semiconductor substrate is generally used. When, a p+ diffused resistor is used as a diffused resistor, for example, resistor R1 has a temperature characteristic shown in FIG. 3.

Figure 3:
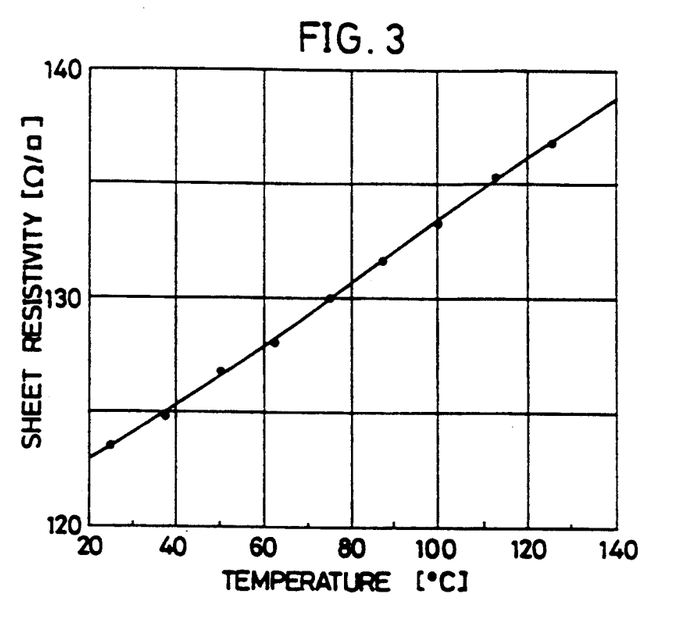
FIG. 3 is a temperature characteristic chart of a diffused resistor used as resistor R1 shown in FIG. 1.

FIG. 3 is a graph showing a temperature characteristic of a p+ diffused resistor used as resistor R1. Referring to FIG. 3, ambient temperature is plotted on the abscissa and sheet resistivity ($\Omega/\square$) on the ordinate. As can be seen from FIG. 3, a resistance value of a diffused resistor increases as ambient temperature increases. In other words, a diffused resistor has a positive temperature coefficient. Therefore, when a diffused resistor is used as resistor R1 shown in FIG. 2, current I1 decreases as ambient temperature increases. In other words, current I1, additionally bias currents I2, I3 and I4 have negative temperature coefficients.

As a result, the oscillation frequency of a ring oscillator becomes gradually lower because of decrease of bias currents as temperature rises. The frequency of- a ring oscillator has a negative temperature coefficient based on a temperature characteristic of resistor R1.

Figure 4:
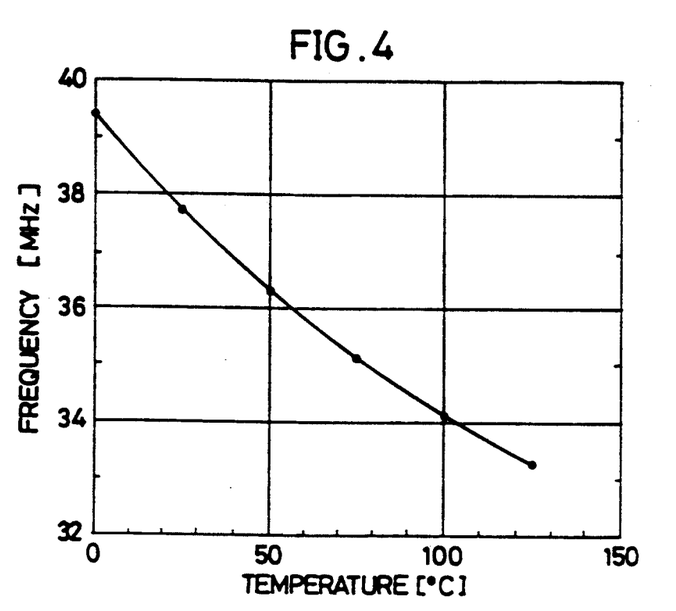
FIG. 4 is a characteristic chart showing a temperature characteristic of the oscillation frequency of inverters cascaded in a ring-like manner.

It should be also pointed out, the oscillation frequency of a ring oscillator becomes gradually lower, as temperature rises based on a temperature characteristic of inverters cascaded in a ring-like manner. FIG. 4 is a characteristic chart showing a temperature characteristic of the oscillation frequency of an oscillation circuit constituted by inverters cascaded in a ring-like manner. Bias currents, namely current I3 and I4, are fixed in FIG. 4. Generally, on-resistance of an MOS transistor increases with a rise of ambient temperature. Therefore, even if bias currents are constant, current flowing through inverters constituting a ring oscillator decreases. As a result, as shown in FIG. 4, the oscillation frequency becomes lower as temperature rises. This means that the oscillation frequency of a ring oscillator becomes gradually lower, not only based on a temperature characteristic of resistor R1, but also based on a temperature characteristic of inverters. The oscillation frequency of a ring oscillator has a negative temperature coefficient based on the temperature characteristic of resistor R1 and the temperature characteristic of the inverters.

As already described, when a ring oscillator is used in a semiconductor integrated circuit device as a reference clock generating circuit, it is desirable to maintain an oscillation frequency constant. The oscillation frequency of the ring oscillator should not be affected by change of ambient temperature. However, the oscillation frequency of ring oscillator 7a shown in FIG. 2 becomes lower as temperature rises, as stated before. It is a problem when ring oscillator 7a shown in FIG. 2 is used.

SUMMARY OF THE INVENTION

One object of the present invention is to compensate change of the oscillation frequency of a ring oscillator circuit caused by change of ambient temperature.

Another object of the present invention is to form a ring oscillator having a stable oscillation frequency against change of temperature in a semiconductor substrate.

Another object of the present invention is to decrease time needed to mount a semiconductor integrated circuit device to a printed circuit board.

In brief, a ring oscillator circuit of the present invention comprises an oscillator circuit including an odd number of inverters cascaded in a ring-like manner. The oscillator circuit has the oscillation frequency changed with changes of ambient temperature. The ring oscillator circuit further comprises a constant voltage generating circuit, a constant current supplying circuit supplied with a constant voltage generated from the constant voltage generating circuit and supplying a constant current to the oscillator circuit, and a temperature compensating circuit compensating a change of oscillation frequency of the oscillation circuit by controlling output current from the constant current supplying circuit in response to ambient temperature. A ring oscillator circuit having the above described configuration is formed on a semiconductor substrate.

In operation, the oscillation frequency of the oscillator circuit tends to change depending on a change of ambient temperature; however, the temperature compensating circuit controls output current from the constant current supplying circuit in response to the ambient temperature and compensates the change of the oscillation frequency. Therefore, the oscillation frequency of the ring oscillator circuit is maintained stable against a change of ambient temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
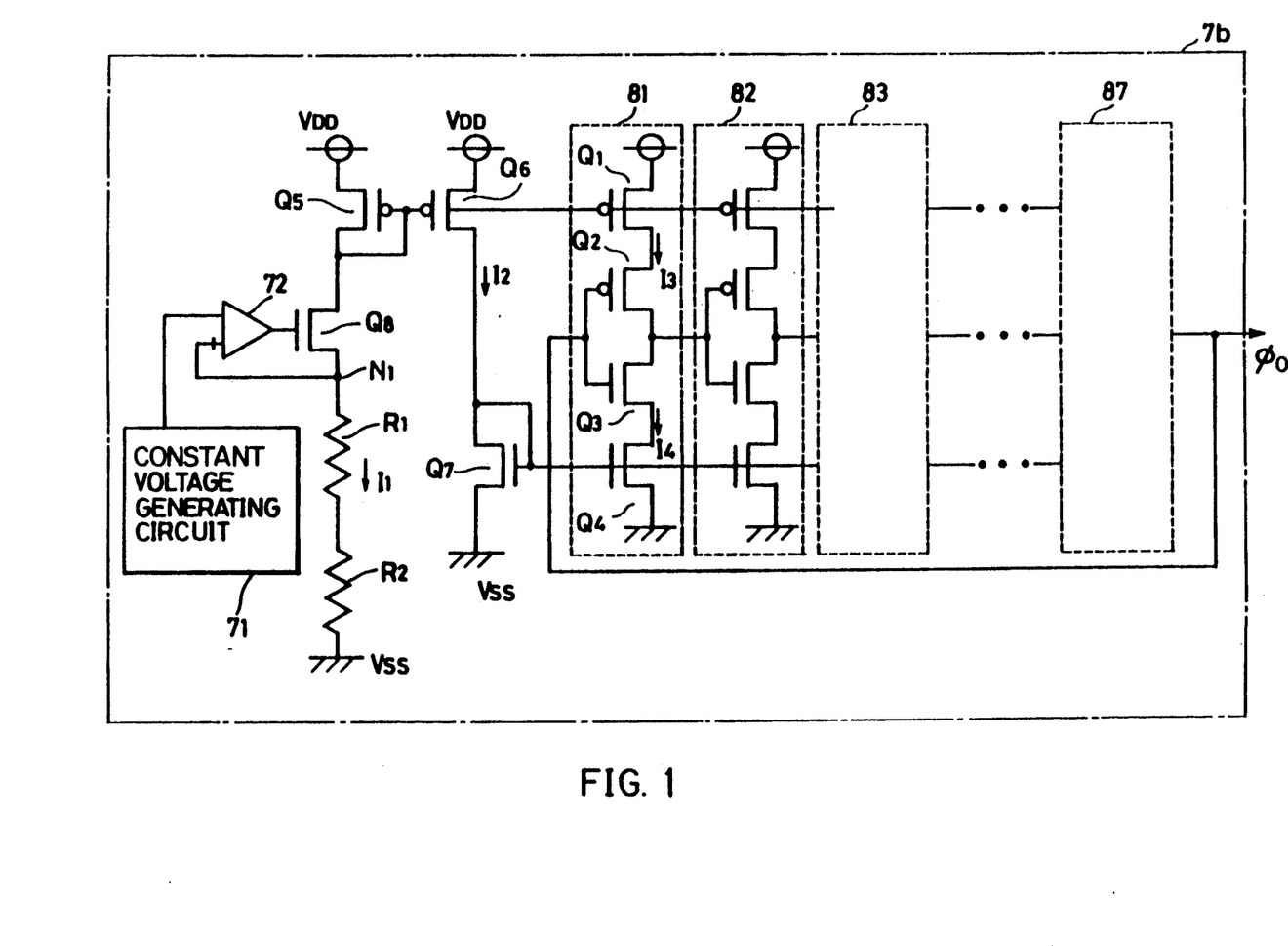
FIG. 1 is a circuit diagram of a ring oscillator showing one embodiment of the present invention.

Referring to FIG. 1, a ring oscillator circuit 7b comprises a resistor R2, together with resistor R1, connected in series between a constant node N1 and a ground potential $V_{SS}$. As resistor R2, a polysilicon resistor having a negative temperature coefficient is used. Since the circuit configuration is the same as that of ring oscillator 7a shown in FIG. 2 except for resistor R2, the description is not repeated.

Figure 5:
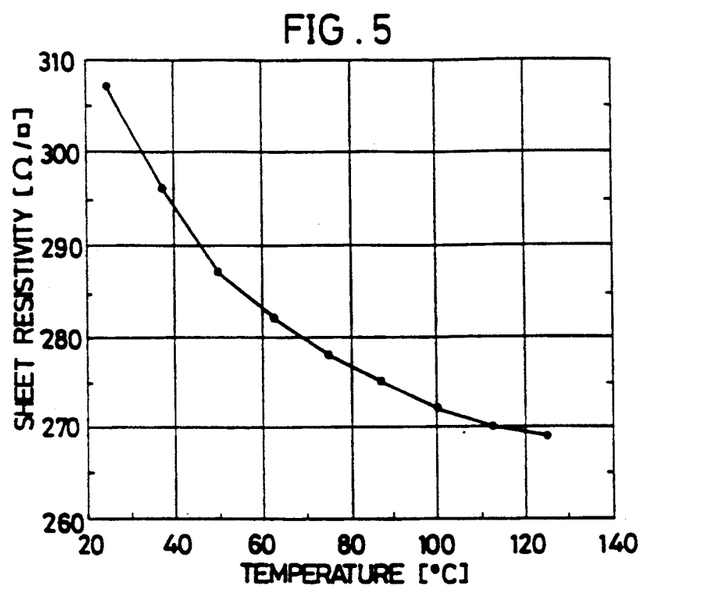
FIG. 5 is a temperature characteristic chart of a polysilicon resistor used as resistor R2 shown in FIG. 1.

FIG. 5 is a temperature characteristic chart of a polysilicon resistor used as resistor R2 shown in FIG. 1. Referring to FIG. 5, temperature (°C.) is plotted on the abscissa and sheet resistivity ($\phi/\f$) on the ordinate.

In ring oscillator 7b shown in FIG. 1, resistor R1 and R2 are connected in series between node N1 and ground potential $V_{SS}$, so that the following expression is satisfied.

$$I2 = I1 = VN1/(R1+R2) \tag{7}$$

Assume that resistance values of resistor R1 and R2 at some reference temperature To are R1 and R2, respectively. In addition, if it is assumed that a function of a rate of a temperature change to R1o of resistor R1 is f(T), and that a function of a rate of a temperature change to R2o of resistor R2 is g(T), the following relation can be obtained.

$$R1(T) = R1o.f(T) \tag{8}$$

$$R2(T) = R2o.g(T) \tag{9}$$

The following expression (10) can be obtained by substituting expressions (8) and (9) in expression (7).

$$I2 = VN1/(R1o.f(T) + R2o.g(T)) \tag{10}$$

If it is assumed that a function of a rate of a temperature change of current I2(T) at a temperature T is h(T)

and that a value of I2(To) at a temperature To is I2o, the following relation can be obtained.

$$h(T) = I2/I2o \tag{11}$$

$$I2o = VN1/(R1o + R2o) \tag{12}$$

The following expression (13) can be derived from expressions (10) and (11).

$$h(T) = (R1o + R2o)/(R1o \cdot f(T) + R2o \cdot g(T)) \tag{13}$$

Therefore, for example, it is possible to set the function of a rate of a temperature change h(T) of current I2 selectively to be a monotone increasing function or a monotone decreasing function by applying materials which respectively have a monotone increasing function f(T) and a monotone decreasing function g(T) to resistors R1 and R2, respectively.

In ring oscillator 7a shown in FIG. 2, as mentioned above, the oscillation frequency has a negative temperature coefficient because of a temperature characteristic of resistor R1 and a temperature characteristic of inverters 81 through 87. Therefore, it is necessary for the function of a rate of a temperature change h(T) of current I2 to be a monotone increasing function, and hence a polysilicon resistor having a negative temperature coefficient is used as resistor R2.

A temperature characteristic chart shown in FIG. 5 should be taken into account in order to determine the ratio of resistor R1 and R2. If it is assumed that current I2 is constant, temperature dependency of an oscillation frequency F (I2(T), T) can be obtained from FIG. 4 as shown below.

$$\frac{\partial F(I2(T), T)}{\partial T} = -4.8 \tag{14}$$

Figure 6:
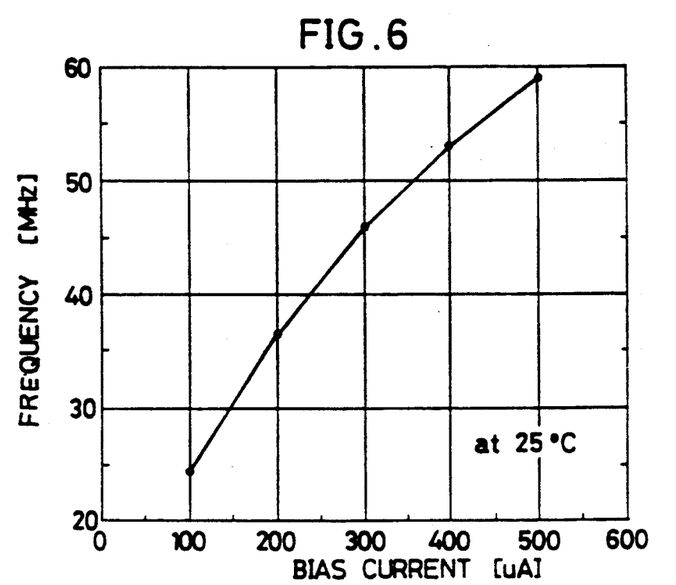
FIG. 6 is a characteristic chart showing relation between bias current and oscillation frequencies in the ring oscillator shown in FIG. 1.

FIG. 6 is a characteristic chart showing relation between bias current I2 and the oscillation frequency of ring oscillator 7b shown in FIG. 1. Referring to FIG. 6 bias current (μA) is plotted on the abscissa and oscillation frequency (Mhz) on the ordinate. As can be seen from the characteristic chart shown in FIG. 6, dependency of oscillation frequency F (I2(T), T) on current I2 can be shown by the following expression using first-order approximation.

$$\frac{\partial F(I2(T), T)}{\partial I2} = 8.6 \tag{15}$$

Therefore, in order to maintain frequency F constant independent of temperature T, the following expression (16) should be satisfied.

$$\frac{dF(I2(T), T)}{dt} = \frac{\partial F}{\partial I2} \cdot \frac{dI2}{dt} + \frac{\partial F}{\partial T} = 0 \tag{16}$$

As a result, the following expression (17) can be obtained from expressions (14), (15) and (16).

$$\frac{dI2(T)}{dt} = 0.56 \tag{17}$$

When expression (17) is satisfied, oscillation frequency F is not affected by change of temperature T.

A method of determining resistors R1 and R2 to make oscillation frequency F constant at temperatures around Tc will be described below.

First, it is necessary to set a ring oscillator to oscillate at a desired oscillation frequency Fc at temperature Tc. The setting is carried out by determining bias current I2. When an oscillation frequency is Fc, bias current I2(Tc) can be obtained from the above mentioned expression (7) as shown below $$I2(Tc) = VN1/(R1(Tc) + R2(Tc)) \tag{18}$$

wherein R1(Tc) and R2(Tc) denote resistance values of resistors R1 and R2 at temperature Tc, respectively.

In order to make oscillation frequency constant, the following relation derived from expression (17) should be satisfied.

$$\begin{aligned} \frac{dI2(T)}{dT} &= \frac{d}{dT}\left(\frac{VN1}{(R1(T) + R2(T))}\right) \\ &= \frac{VN1\left(\frac{dR1(T)}{dT} + \frac{dR2(T)}{dT}\right)}{(R1(T) + R2(T))^2} \\ &= 0.56 \end{aligned} \tag{18'}$$

Therefore, when ambient temperature T is Tc. The following expression can be derived from expression (18).

$$\left.\frac{dI2(T)}{dT}\right|_{T=Tc} \tag{19}$$

$$= -\frac{VN1 \cdot \left(\left.\frac{dR1(T)}{dT}\right|_{T=Tc} + \left.\frac{dR2(T)}{dT}\right|_{T=Tc}\right)}{(R1(Tc) + R2(Tc))^2}$$

$$\therefore \frac{VN1 \cdot \left(\left.\frac{dR1(T)}{dT}\right|_{T=Tc} + \left.\frac{dR2(T)}{dT}\right|_{T=Tc}\right)}{(R1(Tc) + R2(Tc))^2} = 0.56$$

wherein resistors R1(T) and R2(T) can be obtained from the following expressions, respectively:

$$R1(T) = X \cdot r1(T) \tag{20}$$

$$R2(T) = Y \cdot r2(T) \tag{21}$$

wherein r1(T) and r2(T) shows sheet resistivity of resistors R1 and R2.

Therefore, the following expressions (22) and (23) are obtained, and an expression (24) is derived from expressions (18)', (20), and (21).

$$\frac{dR1(T)}{dT} = \frac{dr1(T)}{dT} \quad (22)$$

$$\frac{dR2(T)}{dT} = \frac{dr2(T)}{dT} \quad (23)$$

$$X \cdot r1(Tc) + Y \cdot r2(Tc) = \frac{V\!N1}{I2(Tc)} \quad (24)$$

The following expression is obtained from expressions (18), (19), (22) and (23).

$$\frac{r1\left(X \cdot \frac{dr1(T)}{dT}\bigg|T = Tc + Y \cdot \frac{dr2(T)}{dT}\bigg|T = Tc\right)}{(V1/I2(Tc))^2} = -0.56 \quad (25)$$

In expression (25), since dr1(T)/dT and dr2(T)/dT at ambient temperature Tc are slopes of sheet resistivity r1(T) and (r2(T) at temperature Tc, these can be obtained by referring to temperature characteristics of FIGS. 3 and 5.

Therefore, resistance value R1(T) and R2(T) can be obtained by solving a simultaneous equation of expressions (24) and (25).

Figure 7:
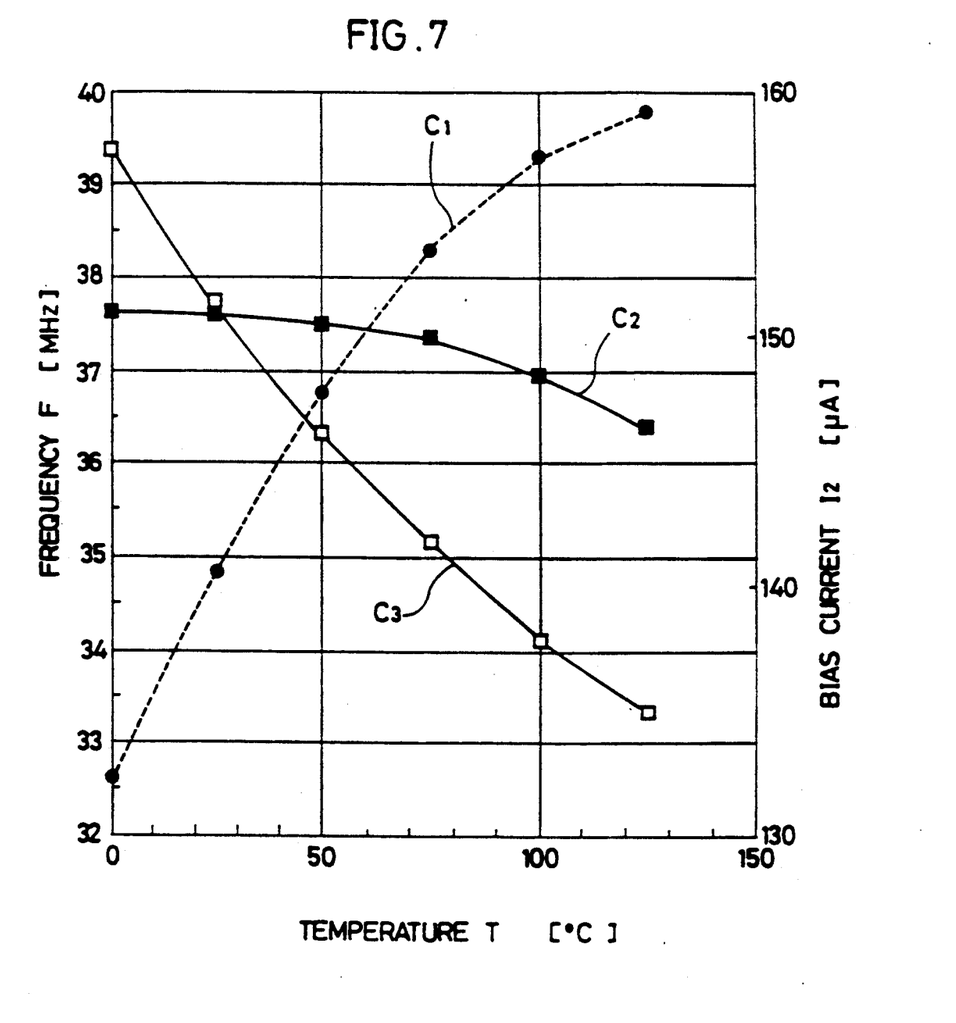
FIG. 7 is a temperature characteristic chart of a temperature-compensated ring oscillator.

FIG. 7 is a temperature characteristic chart of a temperature compensated ring oscillator 7b. Referring to FIG. 7, ambient temperature T (°C.) is plotted on the abscissa, and oscillation frequency F (MHz) and bias current I2 (μA) on the ordinates. A curve C1 shows temperature dependency of temperature-compensated bias current I2. A curve C2 shows temperature dependency of temperature-compensated oscillation frequency F. A curve C3 shows temperature dependency of an oscillation frequency not temperature-compensated for reference. By comparing curves C2 and C3, it should be understood that oscillation frequency F is not easily affected by change of ambient temperature T.

Figure 8:
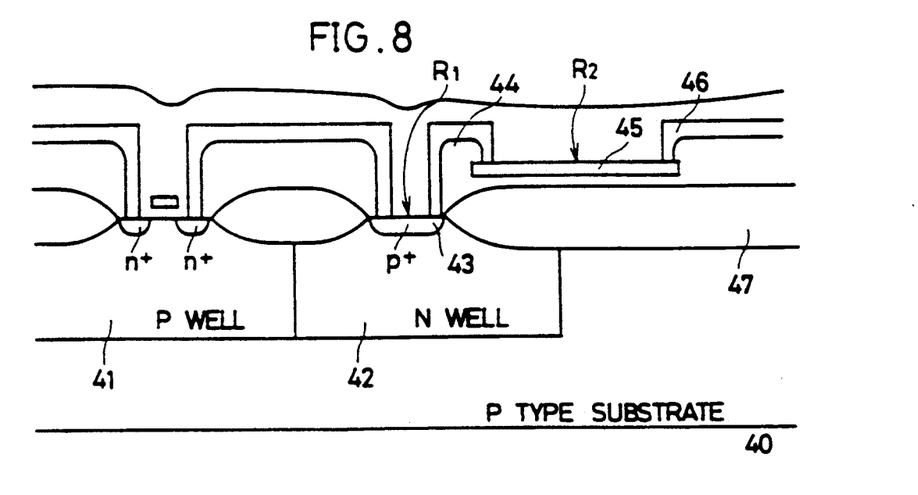
FIG. 8 is a sectional structural view of a diffused resistor and a polysilicon resistor formed on a semiconductor substrate.

FIG. 8 is a sectional structural view of resistors R1 and R2 formed on a semiconductor substrate. Referring to FIG. 8, a P well 41 and an N well 42 are formed in a P type silicon substrate 40. P+ diffused resistor 43 used as resistor R1 is formed in N well 42. A polysilicon resistor 45 used as resistor R2 is formed on a LOCOS 47 for isolation. Polysilicon resistor 45 is connected to diffused resistor 43 through an aluminum interconnection 44.

In order to provide a temperature characteristic shown in FIG. 5 to polysilicon resistor 45 shown in FIG. 8, polysilicon should be subjected to the following treatment.

First, polysilicon is ion implanted with arsenic As of a dose of $5.0 \times 10^{15} \text{cm}^{-2}$ having an acceleration voltage of 50 KeV. Subsequently, an anneal process is performed at a temperature of 800° C. in a nitrogen atmosphere for 30 minutes and in an oxygen atmosphere for 30 minutes. As a result, a polysilicon resistor having the temperature characteristic shown in FIG. 5 can be obtained.

Figure 9:
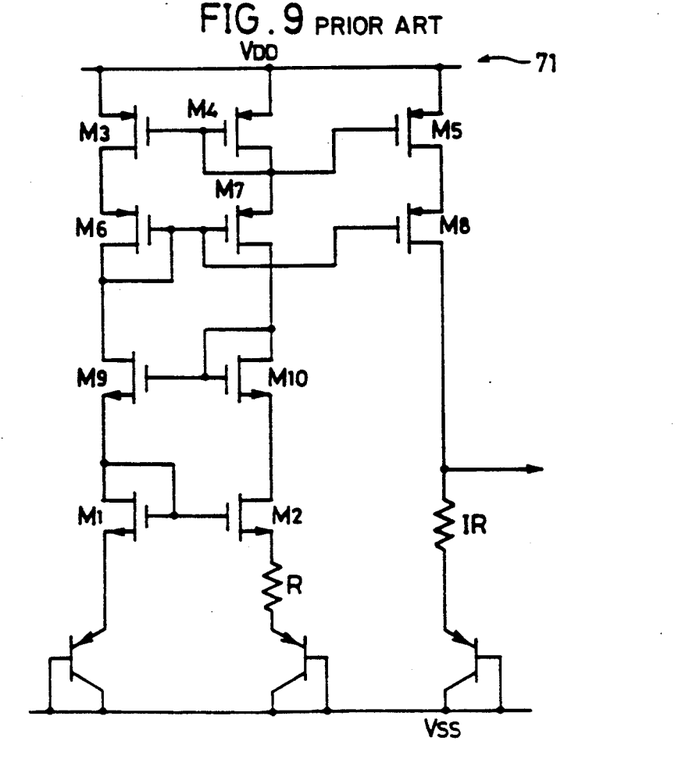
FIG. 9 is a circuit diagram of a constant voltage generating circuit shown in FIG. 1.

FIG. 9 is a circuit diagram of constant voltage generating circuit 71 shown in FIG. 1. Constant voltage generating circuit 71 shown in FIG. 9 is a bandgap reference bias type, of which details are disclosed in a text book titled *Analysis of Design of Analog Integrated Circuits* written by P. R. Gray and R. G. Meyer. Constant voltage generating circuit 71 shown in FIG. 9 can generate a constant and stable voltage independent of an ambient temperature. As constant voltage generating circuit 71 in ring oscillator 7b shown in FIG. 1, other circuits can be applied besides the circuit shown in FIG. 9.

As described above, resistor R1 shown in FIG. 1 has a positive temperature coefficient as shown in FIG. 3, and in addition, the oscillation frequency of inverters 81 through 87 cascaded in a ring-like manner has a negative temperature coefficient as shown in FIG. 4; however, it is possible to stabilize the oscillation frequency against change of an ambient temperature by applying a polysilicon resistor having a negative temperature coefficient as shown in FIG. 5 as resistor R2. By applying a diffused resistor and a polysilicon resistor having a relation as described above to resistors R1 and R2 in ring oscillator 7b shown in FIG. 1, respectively, a temperature characteristic of a stabilized oscillation frequency is obtained as indicated by curve C2 shown in FIG. 7.

As a result, a clock signal generating circuit having an oscillation frequency stable against change of temperature, namely, a ring oscillator can be formed in a semiconductor substrate, so that a conventional crystal oscillator is not necessary. Therefore, the number of parts is reduced and so is time needed for work of mounting the parts to a printed circuit board.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A ring oscillator circuit formed on a single semiconductor substrate, comprising:
    oscillator circuit means including an odd number of inverter means cascaded in a ring-like manner;
    said oscillator circuit means having an oscillation frequency changed dependent on change of an ambient temperature,
    a constant voltage generating means; and
    a constant current supplying means supplied with a constant voltage generated from said constant voltage generating means and supplying a constant current to said oscillator circuit means; and
    temperature compensating means connected to said constant current supplying means for compensating change of the oscillation frequency of said oscillator circuit means by controlling output current from said constant current supplying means in response to the ambient temperature.

2. The ring oscillator circuit according to claim 1, wherein said constant current supplying means supplies the constant current to each of said odd number of inverters, based on the constant voltage generated from said constant voltage generating means.

3. The ring oscillator circuit according to claim 2, wherein said constant current supplying means comprises
    a current mirror circuit including a primary circuit and a secondary circuit, and
    primary current supplying means for supplying a primary current to said primary circuit of said current mirror circuit, based on the constant voltage generated from said constant voltage generating means;

said secondary circuit of said current mirror circuit supplying a secondary current to each of said odd number of inverters in response to the primary current, said temperature compensating means compensating change of the oscillation frequency of said oscillator circuit means by controlling the primary current supplied from said primary current supplying means in response to the ambient temperature.

4. The ring oscillator circuit according to claim 3, wherein said constant current supplying means has the output current changed depending on the ambient temperature based on temperature characteristic of itself; and said oscillator circuit means has the oscillation frequency changed depending on change of the ambient temperature based on the temperature characteristic of itself and change of the output current from said constant current supplying means.

5. The ring oscillator circuit according to claim 4, wherein said primary current supplying means comprises a constant voltage node receiving the constant voltage generated from said constant voltage generating means and first resistor means connected to said constant voltage node and having a first temperature characteristic; and said temperature compensating means comprises second resistor means connected in series between said constant voltage node and a predetermined potential together with said first resistor means, said second resistor means having a second temperature characteristic which is opposite to said first temperature characteristic.

6. The ring oscillator circuit according to claim 5, wherein said first resistor means has the resistance value changed corresponding to a positive temperature coefficient, and said second resistor means has the resistance value changed corresponding to a negative temperature coefficient.

7. The ring oscillator circuit according to claim 6, wherein said first resistor means includes a diffused resistor formed in said semiconductor substrate; and said second resistor means includes a polysilicon resistor formed on said semiconductor substrate.

* * * * *